United States Patent
Lee et al.

(10) Patent No.: US 11,112,438 B2
(45) Date of Patent: Sep. 7, 2021

(54) NONLINEAR OSCILLATION DETECTION METHOD BASED ON MEASUREMENT DATA, AND RECORDING MEDIUM AND APPARATUS FOR PERFORMING THE SAME

(71) Applicant: Korea University Research and Business Foundation, Seoul (KR)

(72) Inventors: Byongjun Lee, Seoul (KR); Hwanhee Cho, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 208 days.

(21) Appl. No.: 16/434,684

(22) Filed: Jun. 7, 2019

(65) Prior Publication Data
US 2020/0333388 A1    Oct. 22, 2020

(30) Foreign Application Priority Data
Apr. 19, 2019    (KR) .................. 10-2019-0046213

(51) Int. Cl.
*G01R 23/20* (2006.01)
*H02J 3/38* (2006.01)
*G05B 1/00* (2006.01)

(52) U.S. Cl.
CPC .............. *G01R 23/20* (2013.01); *H02J 3/382* (2013.01)

(58) Field of Classification Search
CPC ........ G06N 3/00; G05B 1/00; G05B 2219/00; G06F 1/00; H02J 1/00
See application file for complete search history.

(56) References Cited

U.S. PATENT DOCUMENTS

| | | | |
|---|---|---|---|
| 2009/0204245 A1* | 8/2009 | Sustaeta | H04L 67/125 |
| | | | 700/99 |
| 2014/0032148 A1* | 1/2014 | Verhulst | G01R 27/16 |
| | | | 702/65 |
| 2016/0245850 A1* | 8/2016 | Kasztenny | G01R 23/02 |

(Continued)

FOREIGN PATENT DOCUMENTS

| | | |
|---|---|---|
| JP | 2005-094831 A | 4/2005 |
| JP | 2008-014679 A | 1/2008 |

(Continued)

OTHER PUBLICATIONS

Korean Notice of Allowance dated Apr. 29, 2020, in connection with the Korean Patent Application No. 10-2019-0046213 citing the above reference(s).

(Continued)

*Primary Examiner* — Jermele M Hollington
*Assistant Examiner* — Temilade S Rhodes-Vivour
(74) *Attorney, Agent, or Firm* — Hauptman Ham, LLP (57) ABSTRACT

Provided is a nonlinear oscillation detection method at an electric power system, and a recording medium and apparatus for performing the method. The nonlinear oscillation detection apparatus at the electric power system detects various kinds of nonlinear oscillation occurring at the electric power system by applying a nonlinear oscillation precognition algorithm based on a nonlinear dynamic theory to the time series information measured at the electric power system.

12 Claims, 9 Drawing Sheets

(56) References Cited

U.S. PATENT DOCUMENTS

2019/0114557 A1* 4/2019 Ashrafi .................... G06T 1/20
2019/0150847 A1* 5/2019 Nakayama ............. B60K 28/06

FOREIGN PATENT DOCUMENTS

KR 10-2003-0035275 A 5/2003
KR 10-2008-0086794 A 9/2008

OTHER PUBLICATIONS

Hwanhee Cho et al., "Non-Linear dynamics based sub-synchronous resonance index by using power system measurement data" IET Generation, Transmission & Distribution, Aug. 28, 2018, pp. 4026-4033, vol. 12 Iss. 17, Korea.

* cited by examiner

NONLINEAR OSCILLATION DETECTION METHOD BASED ON MEASUREMENT DATA, AND RECORDING MEDIUM AND APPARATUS FOR PERFORMING THE SAME

CROSS-REFERENCE TO RELATED APPLICATIONS

This application claims priority under 35 U.S.C. § 119 to Korean Patent Application No. 10-2019-0046213, filed on Apr. 19, 2019, in the Korean Intellectual Property Office, the disclosure of which is incorporated herein by reference in its entirety.

TECHNICAL FIELD

The following disclosure relates to a nonlinear oscillation detection method based on measurement data, and a recording medium and apparatus for performing the method, and in particular, to a nonlinear oscillation detection method based on measurement data observed in an electric power system, and a recording medium and apparatus for performing the method.

BACKGROUND

An electric power system may generally include a power generator, a transmission line and a load. In recent years, in order to prepare for the energy depletion of the system and environmental pollution, power generation facilities using renewable energy such as solar energy or wind energy are actively being introduced.

However, because the power plant using renewable energy has high uncertainty, when the electric power system has a failure, the physical quantity measured at each point may be exhibited as an oscillation form, which may give serious influence on the entire power system.

The nonlinear oscillation, which may appear due to a fault in the electric power system, is continued or gradually increased. The oscillation that may be caused by the fault in the electric power system may be observed in an oscillation mode with a low frequency of 0.1 to 2 Hz band or in an oscillation mode by sub-synchronous resonance in 15 to 50 Hz band. Here, since the oscillation mode by synchronous resonance has a rapid effect on the spreading rate and the system, it is difficult for a system operator to secure the time from checking the oscillation till taking an action.

A nonlinear oscillation detection method in the conventional electric power system includes a frequency domain based method and a time domain direct detection method. The frequency domain based method is accurate but requires a large amount of accumulated signal data. The time domain direct detection method typically applies a wavelet transformation technique, which is applicable after a certain periods of oscillation phenomenon is observed.

As described above, the nonlinear oscillation detection method used for the conventional electric power system takes a long time till detecting the oscillation.

SUMMARY

An embodiment of the present disclosure is directed to providing a nonlinear oscillation detection method based on measurement data, which may detect a nonlinear oscillation phenomenon in real time by using physical quantity measurement data measured in real time at an electric power system, and a recording medium and apparatus for performing the method.

The technical subject of the present disclosure is not limited to the above, and other technical subjects not mentioned herein may be clearly understood by those skilled in the art from the following disclosure.

In one general aspect, a nonlinear oscillation detection apparatus comprises: a measurement unit configured to obtain time series information by measuring a physical quantity of an electric power system whose nonlinear oscillation is to be detected; a change rate calculation unit configured to calculate a change rate of the time series information; a plane distance calculation unit configured to depict a trajectory representing a relationship between the time series information and the change rate of the time series information and a point representing a normal state of the electric power system on a two-dimensional coordinate plane, select a measurement point according to a slope of the trajectory representing the relationship between the time series information and the change rate of the time series information, and calculate a distance from the measurement point to the point representing the normal state of the electric power system as a plane distance; a regression estimation unit configured to estimate a nonlinear curve by using the plane distance; and a determination unit configured to determine whether nonlinear oscillation occurs at the electric power system by calculating a largest Lyapunov exponent of the nonlinear curve.

Meanwhile, the nonlinear oscillation detection apparatus may further comprise a frequency calculation unit configured to calculate a frequency of oscillation represented by the physical quantity of the electric power system by measuring time whenever the plane distance is calculated during one cycle of the oscillation represented by the physical quantity of the electric power system.

In addition, the plane distance calculation unit may obtain moving averages of the time series information and the change rate of the time series information during one cycle of oscillation represented by the physical quantity of the electric power system respectively as estimated values representing time series information and a change rate of the time series information when the electric power system is in a normal state.

In addition, the plane distance calculation unit may select a point in the trajectory representing the relationship between the time series information and the change rate of the time series information at which the change rate of the time series information has a value equal to or smaller than a change rate of time series information when the electric power system is in a normal state and a slope of the trajectory changes from a positive value to a negative value, as the measurement point.

In addition, the regression estimation unit may estimate the nonlinear curve by applying a nonlinear regression method to a data set in which the plane distance calculated at every cycle of oscillation represented by the physical quantity of the electric power system is accumulated.

In addition, when the largest Lyapunov exponent of the nonlinear curve exceeds 0, the determination unit may predict that nonlinear oscillation is to be detected at the electric power system.

In addition, the nonlinear oscillation detection apparatus may further comprise an output unit configured to output the determination result of the determination unit on whether nonlinear oscillation is to be detected.

Meanwhile, a nonlinear oscillation detection method of a nonlinear oscillation detection apparatus that is included in an electric power system to detect nonlinear oscillation of equipment of the electric power system may comprise: obtaining time series information by measuring a physical quantity of the electric power system; calculating a change rate of the time series information; depicting a trajectory representing a relationship between the time series information and the change rate of the time series information and a point representing a normal state of the electric power system on a two-dimensional coordinate plane, and selectively calculating a distance from each point of the trajectory representing the relationship between the time series information and the change rate of the time series information to the point representing the normal state of the electric power system; estimating a nonlinear curve by using a plane distance that is the distance from each point of the trajectory representing the relationship between the time series information and the change rate of the time series information to the point representing the normal state of the electric power system; and determining whether nonlinear oscillation occurs at the electric power system by calculating a largest Lyapunov exponent of the nonlinear curve.

Meanwhile, the nonlinear oscillation detection method may further comprise calculating a frequency of oscillation represented by the physical quantity of the electric power system by measuring time whenever the plane distance is calculated during one cycle of the oscillation represented by the physical quantity of the electric power system.

In addition, the step of depicting a trajectory representing a relationship between the time series information and the change rate of the time series information and a point representing a normal state of the electric power system on a two-dimensional coordinate plane may further include obtaining moving averages of the time series information and the change rate of the time series information during one cycle of oscillation represented by the physical quantity of the electric power system respectively as estimated values representing time series information and a change rate of the time series information when the electric power system is in a normal state.

In addition, the step of selectively calculating a distance from each point of the trajectory representing the relationship between the time series information and the change rate of the time series information to the point representing the normal state of the electric power system may include: selecting a measurement point according to a slope of the trajectory representing the relationship between the time series information and the change rate of the time series information; and calculating a distance from the measurement point to the point representing the normal state of the electric power system as the plane distance.

In addition, the step of selecting a measurement point according to a slope of the trajectory representing the relationship between the time series information and the change rate of the time series information may include selecting a point in the trajectory representing the relationship between the time series information and the change rate of the time series information at which the change rate of the time series information has a value equal to or smaller than a change rate of time series information when the electric power system is in a normal state and a slope of the trajectory changes from a positive value to a negative value, as the measurement point.

In addition, the step of estimating a nonlinear curve by using a plane distance that is the distance from each point of the trajectory representing the relationship between the time series information and the change rate of the time series information to the point representing the normal state of the electric power system may include estimating the nonlinear curve by applying a nonlinear regression method to a data set in which the plane distance calculated at every cycle of oscillation represented by the physical quantity of the electric power system is accumulated.

In addition, the step of determining whether nonlinear oscillation occurs at the electric power system by calculating a largest Lyapunov exponent of the nonlinear curve may include predicting that nonlinear oscillation is to be detected at the electric power system when the largest Lyapunov exponent of the nonlinear curve exceeds 0.

Meanwhile, there is also provided a computer-readable recording medium on which a computer program for performing the nonlinear oscillation detection method is recorded.

According to the present disclosure, since various nonlinear oscillations of an electric power system may be detected in real time based on a mathematical module using real-time measurement data of the electric power system, the nonlinear oscillation may be detected faster, compared to a conventional cumulative data-based oscillation detection method, thereby improving stability and reliability of the electric power system.

DETAILED DESCRIPTION OF EMBODIMENTS

The present disclosure will be described in detail with reference to the accompanying drawings which illustrate, by way of example, specific embodiments in which the present disclosure may be implemented. These embodiments are described in sufficient detail to enable those skilled in the art to implement the present disclosure. It should be understood that various embodiments of the present disclosure are different from each other but need not be mutually exclusive. For example, specific features, structures and characteristics described herein may be implemented in other embodiments without departing from the scope of the present disclosure in connection with one embodiment. It should also be understood that the position or arrangement of individual components in each embodiment may be varied without departing from the scope of the present disclosure. Therefore, the following detailed description is not taken to limit the present disclosure, and the scope of the present disclosure is limited only by the appended claims, along with the full scope of equivalents to which such claims are entitled. In the drawings, like reference signs refer to the same or similar functions throughout several aspects.

Hereinafter, preferred embodiments of the present disclosure will be described in more detail with reference to the drawings.

Figure 1:
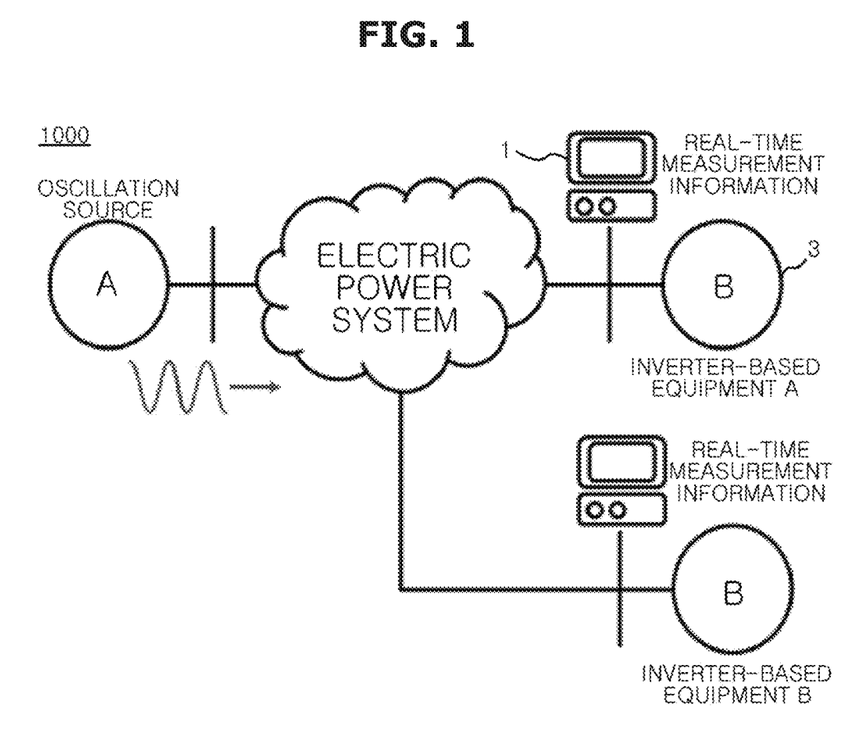
FIG. 1 is a diagram showing an electric power system according to an embodiment of the present disclosure.

FIG. 1 is a diagram showing an electric power system according to an embodiment of the present disclosure.

Referring to FIG. 1, an electric power system 1000 according to an embodiment of the present disclosure may include different kinds of inverter-based equipment 3 and a nonlinear oscillation detection apparatus 1 for detecting nonlinear oscillation of each inverter-based equipment 3.

The nonlinear oscillation detection apparatus 1 may obtain time series measurement data measured at the inverter-based equipment 3. Here, the time series measurement data may include voltage, current or phase angle of the inverter-based equipment 3.

The nonlinear oscillation detection apparatus 1 may detect nonlinear oscillation caused by interference between different kinds of inverter-based equipment 3 or interference between the inverter-based equipment 3 and an oscillation source by using the time series measurement data measured at the inverter-based equipment 3. This will be described later in detail with reference to FIG. 3.

The electric power system 1000 according to an embodiment of the present disclosure may check the risk of system interference and provide the information to a driver more rapidly by detecting the nonlinear oscillation phenomenon using the measurement data of the inverter-based equipment 3 by the nonlinear oscillation detection apparatus 1.

Moreover, if nonlinear oscillation is detected by the nonlinear oscillation detection apparatus 1, the electric power system 1000 according to an embodiment of the present disclosure may port a self-handling strategy therein. Accordingly, the electric power system 1000 according to an embodiment of the present disclosure may contribute to the improvement of stability of the power system due to the self-recovery capability.

Figure 2:
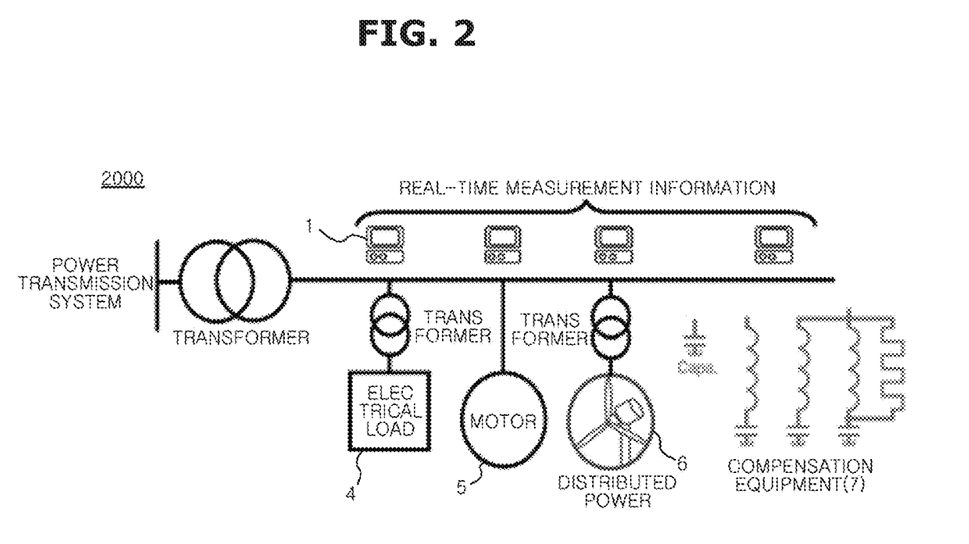
FIG. 2 is a diagram showing an electric power system according to another embodiment of the present disclosure.

FIG. 2 is a diagram showing an electric power system according to another embodiment of the present disclosure.

Referring to FIG. 2, the electric power system 2000 according to another embodiment of the present disclosure may include a power transmission system and an electric distribution system connected to the power transmission system. The electric distribution system may include, for example, a electrical load 4, a motor 5, a distributed power 6, and compensation equipment 7, and may include the nonlinear oscillation detection apparatus 1 for detecting harmonic oscillation of each configuration.

The nonlinear oscillation detection apparatus 1 may obtain the time series measurement data measured at the electric distribution system and detect the harmonic oscillation which may occur due to unintended control of the electric distribution system by using the time series measurement data. This will be described later in detail with reference to FIG. 3.

The electric power system 2000 according to another embodiment of the present disclosure may detect harmonic oscillation early by using real-time measurement information measured at the electric distribution system, thereby eliminating equipment damage and safety problems.

The nonlinear oscillation detection apparatus according to an embodiment of the present disclosure may detect nonlinear oscillation at the electric power system by using the time series information observed at the electric power system.

The nonlinear oscillation detection apparatus according to an embodiment of the present disclosure may implement a nonlinear oscillation precoding algorithm at the electric power system based on a nonlinear dynamic theory. Hereinafter, the nonlinear dynamic theory applied to the nonlinear oscillation detection apparatus according to an embodiment of the present disclosure will be described briefly.

Generally, the electric power system may transmit the generated electricity from a three-phase structure of a power generator to a three-phase transmission network. Here, the instantaneous value of each phase may represent a constant waveform with a fundamental frequency of 60 Hz. The power system constructed mechanically and electrically may be represented as a nonlinear system as in Equations 1 and 2 below.

$$\dot{x} = f(t,x), \, x(t_0) = x_0 \quad \text{[Equation 1]}$$

$$x_0 = \sqrt{2} X_{m0} \cdot \cos(2\pi f_0 t + \theta_0) \quad \text{[Equation 2]}$$

Figure 3:
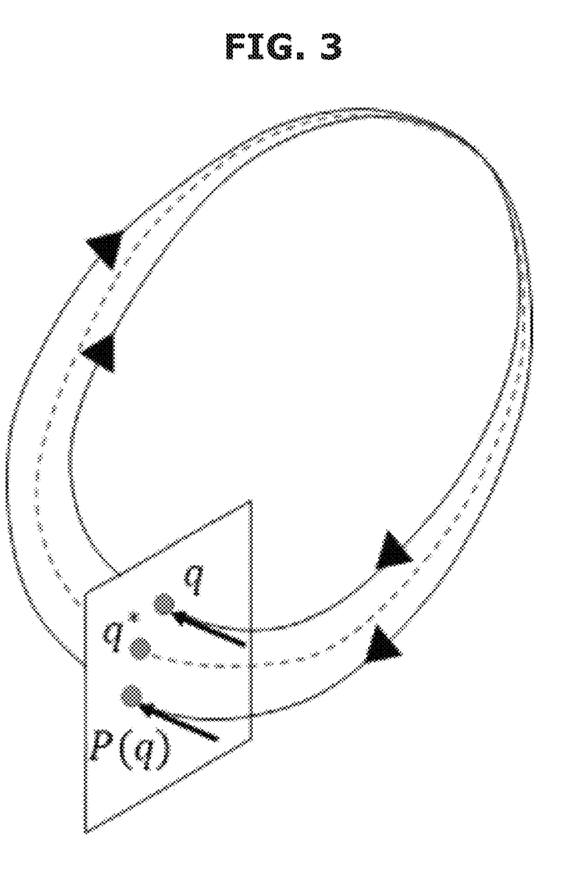
FIG. 3 is a diagram showing a Poincaré plane for explaining a dynamic theory.

If the solution (t,x) of Equation 1 oscillates at a constant cycle, the solution may be shown in the form of trajectory as shown in FIG. 3.

FIG. 3 is a diagram showing a Poincaré plane for explaining a dynamic theory.

Referring to FIG. 3, if the solution of the electric power system, namely a physical quantity observed at the electric power system, oscillates at a constant cycle, the solution may be expressed in the form of trajectory according to the order.

The Poincaré plane ($\Omega$) is a plane that always crosses perpendicularly with respect to the trajectory according to the order and, for example, may be determined as an N−1 order if the electric power system is N-dimensional.

If the solution of the electric power system stably oscillates and attenuates, the solution of the electric power system may be displayed near a fixed point q* on the Poincaré plane ($\Omega$) for a certain oscillation cycle. The solution of the electric power system displayed on the Poincaré plane ($\Omega$) may be expressed as in Equation 3 and 4 below.

$$P(q^*) = q^* \quad \text{[Equation 3]}$$

$$P(q) = P(q^*) + \left[\frac{\partial P(q^*)}{\partial q}\right](q - q^*) + \text{Higher order term} \quad \text{[Equation 4]}$$

Equation 3 shows the case where the solution of the electric power system converges and Equation 4 shows the relationship between a first intersecting point (q) and a next intersecting point (P(q)) between the Poincaré plane ($\Omega$) and the solution of the electric power system.

In Equation 4, $$\left[\frac{\partial P(q^*)}{\partial q}\right]$$

is a matrix representing a system response to the change of an initial value of the electric power system having a constant oscillation cycle, where the eigenvector of this matrix may be called Floquet Multiplier ($\mu$) and the eigenvector of this matrix may be represented by $q_1$.

Meanwhile, since the nonlinear oscillation detection apparatus according to an embodiment of the present disclosure uses the time series information observed at the electric power system, Equation 4 may be linearized and expressed as in Equation 5 below.

$$P(q) - P(q^*) \cong \left[\frac{\partial P(q^*)}{\partial q}\right](q - q^*) \quad \text{[Equation 5]}$$

Meanwhile, if the threshold Floquet Multiplier ($\mu_1$) has a positive value, the cyclic solution may become unstable. Equation 6 shows the stability of the electric power system in the vicinity of the threshold Floquet Multiplier ($\mu_1$).

$$P(q_1) = \mu_1 q_1 + (1-\mu_1)q^* \quad \text{[Equation 6]}$$

Since the threshold Floquet Multiplier ($\mu_1$) is substantially close to 1 at ordinary time, Equation 6 may be expressed as in Equation 7 below.

$$P(q_1) \cong \mu_1 q_1 \quad \text{[Equation 7]}$$

The equations representing the nonlinear systems such as Equations 1 and 2 may be expressed as in Equations 8 to 11 below, according to the characteristics of the time series information.

$$\frac{dx_0(t)}{dt} = -2\pi\sqrt{2}\,f_0 X_{m0} \cdot \sin(2\pi f_0 t + \theta_0) \quad \text{[Equation 8]}$$

$$f_0 X_{m0} \sin(2\pi f_0 t + \theta_0)|_{t=\tau} = 0 \quad \text{[Equation 9]}$$

$$2\pi f_0 t + \theta_0 = 2\pi n \quad \text{[Equation 10]}$$

$$x_0[n] = \sqrt{2}\, X_{m0} \cos(2\pi n) \quad \text{[Equation 11]}$$

If the differential value of the cyclic solution is 0 as in Equation 9 for the construction of the Poincaré plane ($\Omega$) for the time series information, the equation may be expressed as in Equation 10, and the solution shown on the Poincaré plane ($\Omega$) at time $\tau$ may come into a constant form with no change according to a natural number n as in Equation 11.

Generally, in the electric power system, a different frequency mode may be mixed with the fundamental frequency due to a condition change or the like. This phenomenon may be mathematically expressed as in Equations 12 to 15 below.

$$x_1(t) = \sqrt{2}\, X_{m1} \cos(2\pi f_1 t + \theta_{10}) \quad \text{[Equation 12]}$$

$$\frac{dx(t)}{dt} = -2\pi\sqrt{2}\,f_0 X_{m0}\sin(2\pi f_0 t + \theta_0) + f_1 X_{m1}\sin(2\pi f_1 t + \theta_{10}) \quad \text{[Equation 13]}$$

$$\tau = \frac{1}{2\pi f_0}(2\pi n + \alpha - \theta_0) \quad \text{[Equation 14]}$$

$$x[n] \approx \underbrace{\sqrt{2}\, X_{m0}\cos(2\pi n)}_{\text{fixed component}} + \underbrace{\sqrt{2}\, X_{m1}\cos\left\{2\pi\frac{f_1}{f_0}n + \left(\theta_{10} - \frac{f_1}{f_0}\theta_0\right)\right\}}_{\text{changed component}} \quad \text{[Equation 15]}$$

An unintended oscillation phenomenon at the electric power system may be represented in a form where the solution representing cyclic oscillation of the fundamental frequency of Equation 2 is mixed with a waveform of a different frequency as in Equation 12. At this time, the maximum value of the point or instantaneous waveform in the Poincaré plane ($\Omega$) may be expressed as in Equation 15. Seeing Equation 15, the solution may be divided into a fixed portion of a constant form and a changed component oscillating according to the frequency ratio $f_1/f_0$.

The nonlinear oscillation detection apparatus according to an embodiment of the present disclosure is directed to detecting the changed portion in Equation 15 and may detect nonlinear oscillation based on the time series information observed at the electric power system by implementing a nonlinear oscillation precognition algorithm based on the dynamic theory of the system having the time series information.

Hereinafter, the operation of the nonlinear oscillation detection apparatus according to an embodiment of the present disclosure will be described in detail.

Figure 4:
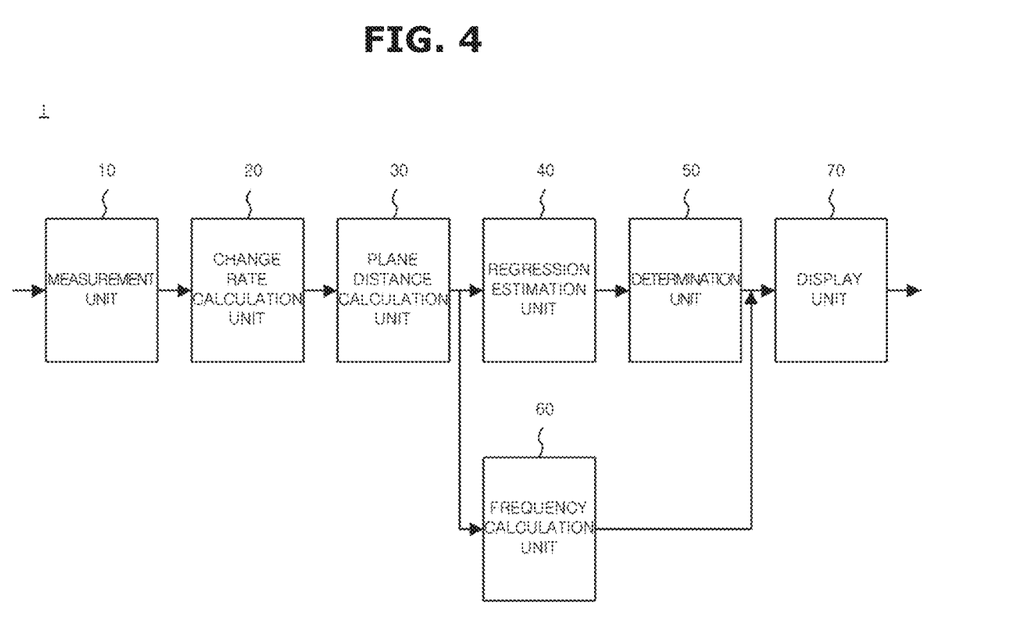
FIG. 4 is a block diagram showing a nonlinear oscillation detection apparatus according to an embodiment of the present disclosure.

FIG. 4 is a block diagram showing a nonlinear oscillation detection apparatus according to an embodiment of the present disclosure.

Referring to FIG. 4, the nonlinear oscillation detection apparatus 1 according to an embodiment of the present disclosure includes a measurement unit 10, a change rate calculation unit 20, a plane distance calculation unit 30, a regression estimation unit 40, a determination unit 50, a frequency calculation unit 60 and a display unit 70.

The nonlinear oscillation detection apparatus 1 according to an embodiment of the present disclosure may be implemented by more or fewer components than the components shown in FIG. 4.

The nonlinear oscillation detection apparatus 1 according to an embodiment of the present disclosure is a device capable of inputting and outputting information, and a software (application) for detecting nonlinear oscillation of an electric power system may be installed and executed. Also, the measurement unit 10, the change rate calculation unit 20, the plane distance calculation unit 30, the regression estimation unit 40, the determination unit 50, the frequency calculation unit 60 and the display unit 70 shown in FIG. 4 may be executed by the software executed in the nonlinear oscillation detection apparatus 1.

The nonlinear oscillation detection apparatus 1 according to an embodiment of the present disclosure may be included as a constitution of the electric power system as shown in FIGS. 1 and 2. When a fault occurs at the electric power system, the physical quantity measured at each point may appear in the form of nonlinear oscillation, which may give a significant influence on the entire power system. The nonlinear oscillation detection apparatus 1 according to an embodiment of the present disclosure is included as a component of the electric power system to detect the occurrence of nonlinear oscillation in the electric power system.

Hereinafter, the components of the nonlinear oscillation detection apparatus 1 according to an embodiment of the present disclosure as shown in FIG. 4 will be described in detail.

The measurement unit 10 may obtain time series information of the electric power system whose nonlinear oscillation is to be detected. The time series information is a physical quantity measured at a specific point of the electric power system and corresponds to voltage (V), current (I), phase angle ($\delta$) and the like.

The measurement unit 10 may measure the physical quantity of the equipment of interest of the electric power system whose nonlinear oscillations is to be detected to obtain time series information.

For example, the measurement unit 10 may be installed at a front end of the equipment of interest or is associated with a measurement device installed at the front end of the equipment of interest to obtain the physical quantity of the equipment of interest as the time series information.

The change rate calculation unit 20 may calculate a change rate of the time series information in real time.

For example, the change rate calculation unit 20 may be implemented using a delay to calculate the change rate of the time series information measured by the measurement unit 10 in real time.

The plane distance calculation unit 30 may configure a two-dimensional plane representing the relationship between the time series information and the change rate of the time series information and selectively calculate a plane distance that is a distance to a value representing the normal state of the equipment of interest on the two-dimensional plane. The plane distance may represent a system response of the electric power system. This will be described in detail later with reference to FIG. 5.

Figure 5:
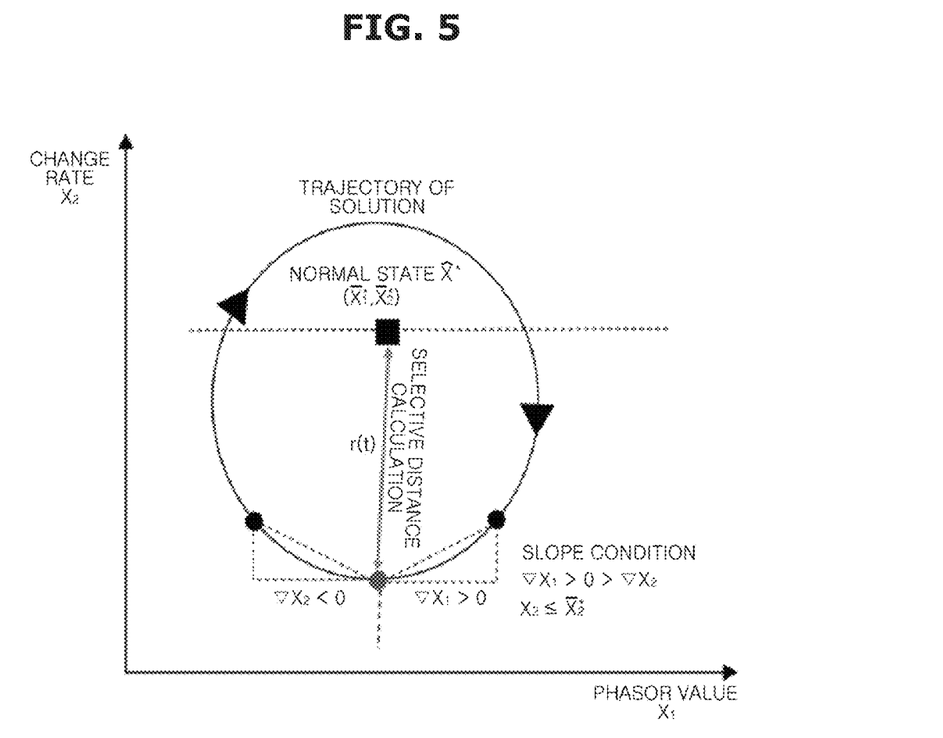
FIG. 5 is a diagram for illustrating a process of calculating a plane distance by the plane distance calculation unit depicted in FIG. 4.

FIG. 5 is a diagram for illustrating a process of calculating a plane distance by the plane distance calculation unit depicted in FIG. 4.

Referring to FIG. 5, the plane distance calculation unit 30 may show the relationship between the time series information and the change rate of the time series information on a two-dimensional coordinate plane. Here, the $x_1$ axis of the two-dimensional coordinate plane corresponds to the time series information (an effective value), and the $x_2$ axis corresponds to the change rate of the time series information.

The plane distance calculation unit 30 may show a trajectory representing the relationship between the time series information and the change rate of the time series information on the two-dimensional coordinate plane.

For example, since a state variable (Such as voltage, angle or other variables) of the electric power system derived as a solution of nonlinear dynamics may be exhibited as a trigonometric function as in Equation 2, the change rate and the relationship on the two-dimensional coordinate plane may be shown in the form of an elliptical trajectory.

The two-dimensional coordinate plane may be called a Poincaré plane (Ω) for the physical quantity generated at the electric power system.

The plane distance calculation unit 30 may represent points representing the time series information and the change rate of the time series information on the two-dimensional coordinate plane when the electric power system is in a normal state.

For example, if an oscillation drawing a specific trajectory occurs at the electric power system, the plane distance calculation unit 30 may calculate a moving average of cyclically oscillating data as an estimated value when the power system is in the normal state, due to the fact that the normal state is formed inside the trajectory.

Thus, the plane distance calculation unit 30 may obtain the moving averages of the time series information obtained by the measurement unit 10 during one oscillation cycle of the electric power system and the change rate of the time series information calculated by the change rate calculation unit 20 respectively as the estimated values of the time series information when the electric power system is in the normal state and the change rate of the time series information, as shown in Equations 16 and 17 below.

$$\overline{X_1}^* = \frac{\sum_{}^{W} X_1}{W}$$ [Equation 16]

$$\overline{X_2}^* = \frac{\sum_{}^{W} X_2}{W}$$ [Equation 17]

Equations 16 and 17 respectively represent the time series information ($\overline{X_1}^*$) and the change rate ($\overline{X_2}^*$) of the time series information when the electric power system is in the normal state, and a window size W of the moving average may be set to be ¼ cycle or more of the oscillation generated at the electric power system.

The plane distance calculation unit 30 may depict the trajectory representing the relationship between the time series information and the change rate of the time series information respectively obtained by the measurement unit 10 and the change rate calculation unit 20 on the two-dimensional coordinate plane as shown in FIG. 5, and display coordinate values ($\overline{X_1}^*, \overline{X_2}^*$) representing the case where the electric power system is in the normal state.

The plane distance calculation unit 30 may selectively calculate a distance from the trajectory representing the relationship between the time series information measured at the electric power system and the change rate of the time series information to the coordinate value representing the case that the electric power system in a normal state.

The plane distance calculation unit 30 may select a measurement point based on the slope of each point of the trajectory representing the relationship between the time series information measured at the electric power system and the change rate of the time series information.

For example, the plane distance calculation unit 30 may select a point at which the effective value change rate ($X_2$) has a value equal to or smaller than the change rate ($\overline{X_2}^*$) of the time series information when the electric power system is in the normal state in the trajectory representing the relationship between the time series information measured at the electric power system and the change rate of the time series information, and the slope of the trajectory changes from a positive value to a negative value, as the measurement point.

The plane distance calculation unit 30 may calculate the distance from the measurement point to the coordinate value ($\overline{X_1}^*, \overline{X_2}^*$) representing the case where the electric power system is in the normal state, as the plane distance (r(t)).

$$r_X(t) = \sqrt{(\overline{X_1}^* - X_1)^2 + (\overline{X_2}^* - X_2)^2}$$ [Equation 18]

$$r(t) = \{r_X(t) | \nabla X_1 > 0 > \nabla X_2, X_2 \leq \overline{X_2}^*\}$$ [Equation 19]

$$r(t+T) = r(t) + \epsilon$$ [Equation 20]

Equation 18 shows a plane distance that is selectively calculated for the trajectory representing the relationship between the time series information and the change rate of the time series information measured at the electric power system, and Equation 19 shows a selection condition for calculating the plane distance in the trajectory the relationship between the time series information measured at the electric power system and the change rate of the time series information.

Equation 20 shows cycle characteristics of the plane distance calculated from the trajectory representing the relationship between the time series information measured at the electric power system and the change rate of the time series information. Here, T represents an oscillation cycle occurring at the electric power system, and E represents the selective increase or decrease of the distance after one cycle of the electric power system, whose magnitude varies depending on the characteristics of the oscillation but is generally relatively small compared to r(t).

Accordingly, the plane distance calculation unit 30 may calculate the plane distance for each cycle of oscillation occurring at the electric power system.

The regression estimation unit 40 may estimate a nonlinear curve from a set of plane distances calculated at every cycle of oscillation occurring at the electric power system. Here, the nonlinear curve may be defined as a curve capable of exhibiting a system response after a few seconds of the electric power system.

Since the set of plane distances calculated at each cycle of the oscillation occurring at the electric power system is in the form of discrete information, it is necessary to estimate the form of the curve as a gentle nonlinear exponent from which the oscillation component is removed.

Thus, the regression estimation unit 40 may estimate the nonlinear curve representing the system response of the electric power system by applying a nonlinear regression method to the set of plane distances calculated at each cycle of oscillation occurring at the electric power system.

Since the responses of dynamic systems defined in natural and physical systems are generally given in an exponential form, the regression estimation unit 40 may perform cumulative regression estimation by using a nonlinear regression model defined as Equation 21 below.

$$\hat{r}(t) = a \cdot e^{b \cdot t + c} + d \qquad \text{[Equation 21]}$$

Briefly, the nonlinear regression method is used to estimate a, b, c and d of Equation 21 by setting initial values $a_0$, $b_0$, $c_0$, $d_0$ and iteratively minimizing a square sum of residual errors. In other words, the nonlinear regression method uses a principle of estimating a, b, c and d while adjusting the initial values $a_0$, $b_0$, $c_0$, $d_0$. In Equation 21, $\hat{r}(t)$ corresponds to the plane distance estimated using the plane distance (r(t)), where a represents a size of the estimated plane distance, b represents a degree of divergence or convergence of the system determined by the model for the plane distance, c represents a time delay constant of the plane distance, and d represents an offset of the plane distance r(t).

The nonlinear regression method requires four estimation variables a, b, c and d. Thus, the regression estimation unit 40 may collect plane distance data calculated at every cycle of oscillation occurring in at least four electric power systems.

Meanwhile, if the discrete data accumulated in the time order is uniformly distributed, the residual error becomes a minimum value and the R squared value (decision coefficient) becomes close to 1. Here, the R squared value may be expressed as in Equation 22 below.

$$R^2 = 1.0 - \frac{\sum (r(t) - \hat{r}(t))^2}{(r(t) - \bar{r}(t))^2} \qquad \text{[Equation 22]}$$

In Equation 22, r(t) represents the plane distance calculated by the plane distance calculation unit 30, $\hat{r}(t)$ represents the plane distance estimated by the regression estimation unit 40, and $\bar{r}(t)$ represents an average of the plane distances calculated by the plane distance calculation unit 30.

The determination unit 50 may determine whether nonlinear oscillation occurs at the electric power system by using the nonlinear curve estimated by the regression estimation unit 40.

The determination unit 50 may calculate a largest Lyapunov exponent for the nonlinear curve in order to quantify the determination of the nonlinear oscillation occurrence from the nonlinear curve for the plane distance calculated at every cycle of oscillation occurring at the electric power system. The determination unit 50 may calculate the largest Lyapunov exponent for the nonlinear curve by using Equation 23 below.

$$\lambda_i(k\Delta t) = \frac{1}{Nk\Delta t} \sum_{m=1}^{N} \log \frac{|\hat{r}_{(k+m)\Delta t} - \hat{r}_{(k+m-1)\Delta t}|}{|\hat{r}_{m\Delta t} - \hat{r}_{(m-1)\Delta t}|} \qquad \text{[Equation 23]}$$

In Equation 23, N represents the number of lengths of the entire data, m represents a variable related to the initial data change, which is a value reflected while increasing from 1 to N, k represents a fixed step value greater than m set to calculate data convergence, and $\Delta t$ represents the sampling cycle of an electric power system measurement element.

The determination unit 50 may calculate the largest Lyapunov exponent by applying the nonlinear curve ($\hat{r}(t)$) estimated by the regression estimation unit 40 to Equation 23 and determine whether the electric power system is stable within the entire data size N as in Equations 24 and 25 below.

$$\lambda_i(k\Delta t) \leq 0 \Rightarrow \text{stable} \qquad \text{[Equation 24]}$$

$$\lambda_i(k\Delta t) > 0 \Rightarrow \text{unstable} \qquad \text{[Equation 25]}$$

If the largest Lyapunov exponent of the nonlinear curve is less than 0 according to Equation 24, the determination unit 50 may determine that the electric power system is stable.

If the largest Lyapunov exponent of the nonlinear curve ($\hat{r}(t)$) is greater than 0 according to Equation 25, the determination unit 50 may determine that the electric power system is unstable since nonlinear oscillation is to be detected at the electric power system.

Meanwhile, the frequency calculation unit 60 may directly calculate the frequency of the oscillation occurring at the electric power system by measuring the time whenever the plane distance calculation unit 30 calculates the plane distance.

Since the plane distance is calculated at every cycle of the oscillation occurring at the electric power system, the frequency calculation unit 60 may calculate the frequency of the oscillation by measuring the time when the plane distance is calculated.

The display unit 70 may output various data calculated by the nonlinear oscillation detection apparatus 1 according to an embodiment of the present disclosure. To this end, the display unit 70 may be implemented as a display device. Alternatively, the display unit 70 may have a communication function to transmit various data to a manager terminal of the electric power system so that the data is output from the manager terminal.

For example, the display unit 70 may output the frequency of the oscillation occurring at the electric power system calculated by the frequency calculation unit 60.

Alternatively, the display unit 70 may output the result of the determination on the risk of the electric power system by the determination unit 50.

Alternatively, the display unit 70 may visualize the largest Lyapunov exponent calculated by the determination unit 50 or visualize the two-dimensional coordinate plane depicted by the plane distance calculation unit 30.

The nonlinear oscillation detection apparatus 1 according to an embodiment of the present disclosure may detect various nonlinear oscillations of the electric power system based on a mathematical module using real-time measurement data of the electric power system. Accordingly, if the nonlinear oscillation detection apparatus 1 according to an embodiment of the present disclosure is applied to the electric power system, the nonlinear oscillation detection speed may be increased to improve stabilization and reliability of the electric power system.

Hereinafter, a nonlinear oscillation detection method according to an embodiment of the present disclosure will be described.

The nonlinear oscillation detection method according to an embodiment of the present disclosure may be performed using substantially the same configuration as the nonlinear oscillation detection apparatus 1 according to an embodiment of the present disclosure as shown in FIG. 4. Thus, the same component as in the apparatus 1 of FIG. 4 is denoted by the same reference numeral and will not be described in detail again.

Figure 6:
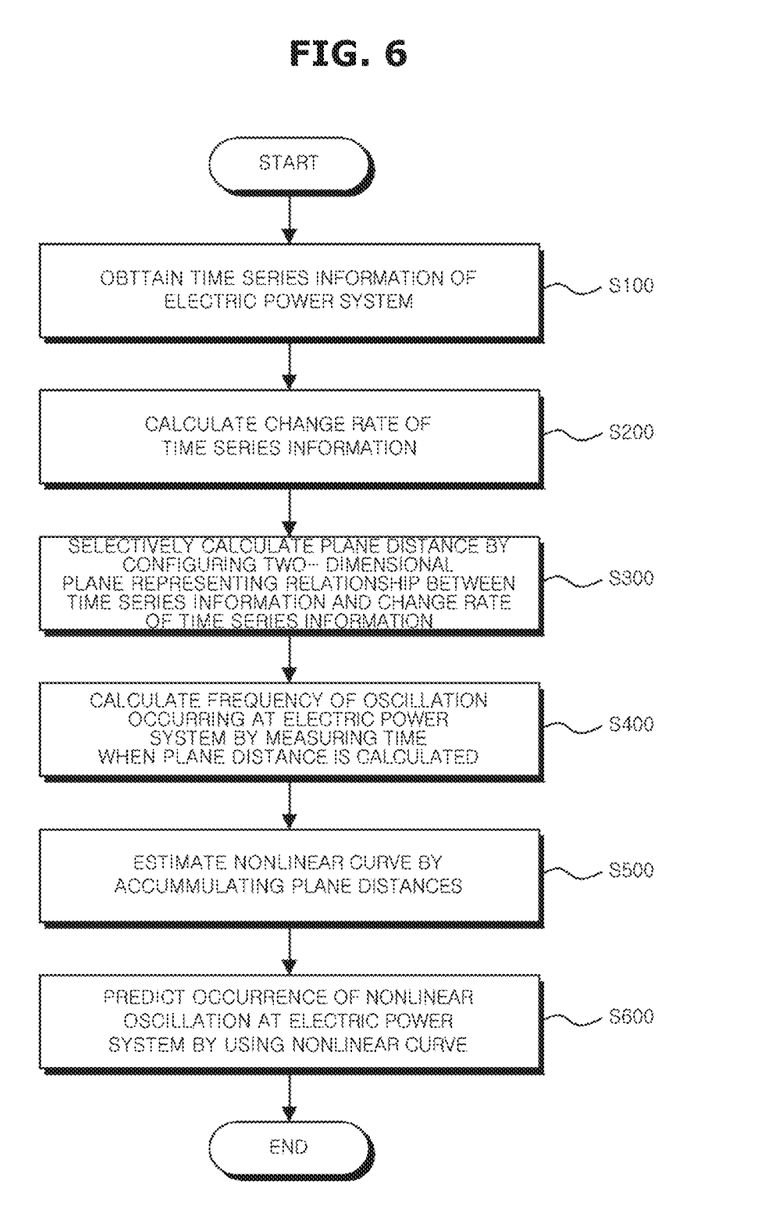
FIG. 6 is a flowchart for illustrating a nonlinear oscillation detection method according to an embodiment of the present disclosure.

FIG. 6 is a flowchart for illustrating a nonlinear oscillation detection method according to an embodiment of the present disclosure.

Referring to FIG. 6, the measurement unit 10 may obtain time series information of the electric power system (S100).

The time series information is a physical quantity measured at a specific point of the electric power system and corresponds to voltage (V), current (I), phase angle (δ) and the like.

The change rate calculation unit 20 may calculate a change rate of the time series information (S200).

The plane distance calculation unit 30 may configure a two-dimensional plane representing the relationship between the time series information and the change rate of the time series information to selectively calculate the plane distance (S300). This will be described later in detail with reference to FIG. 7.

The frequency calculation unit 60 may calculate the frequency of oscillation occurring at the electric power system by measuring the time when the plane distance is calculated (S400).

Since the plane distance is calculated at every cycle of oscillation occurring at the electric power system, the frequency calculation unit 60 may calculate the frequency of the oscillation when measuring the time when the plane distance is calculated.

The regression estimation unit 40 may estimate a nonlinear curve by accumulating the plane distances (S500). This will be described later in detail with reference to FIG. 8.

The determination unit 50 may predict whether the nonlinear oscillation occurs at the electric power system by using the nonlinear curve (S600). This will be described later in detail with reference to FIG. 9.

Figure 7:
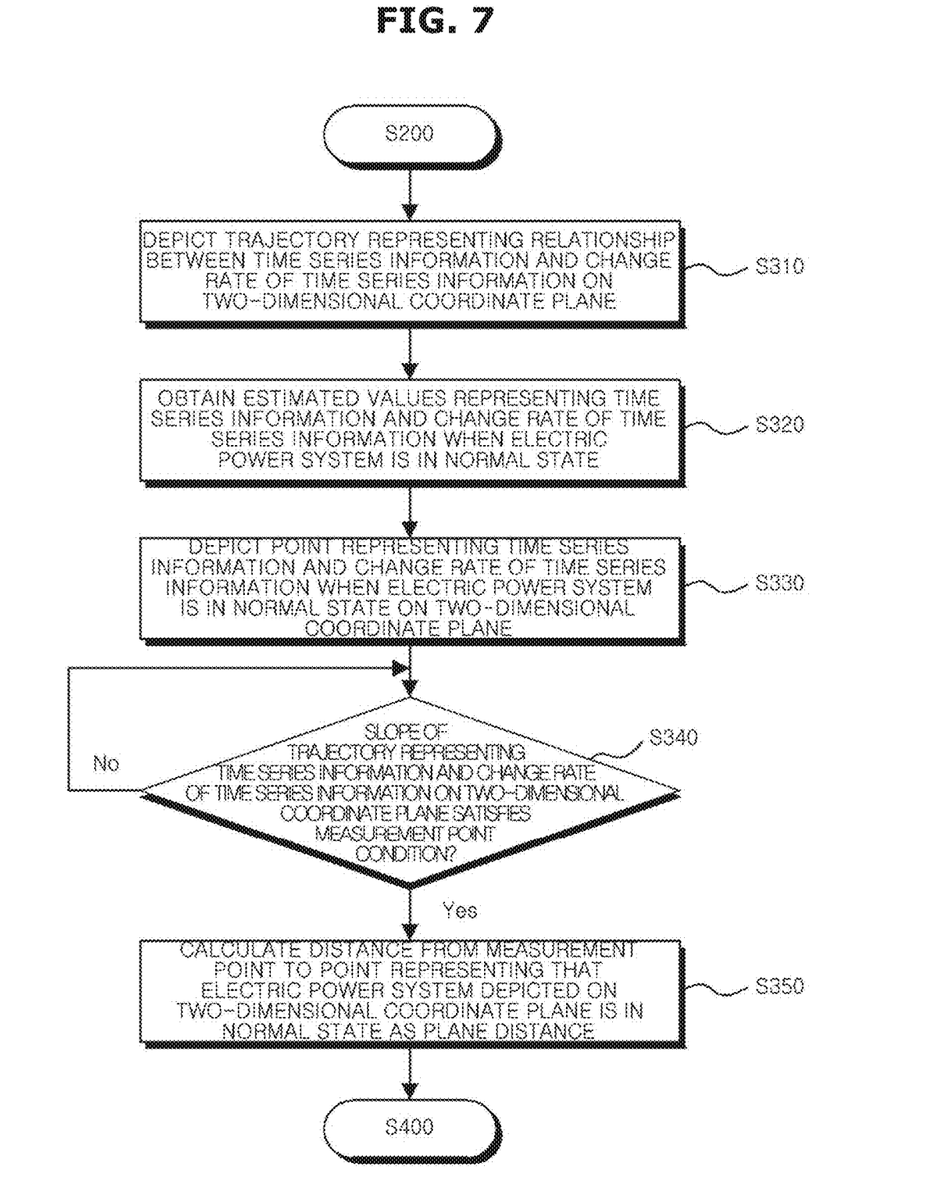
FIG. 7 is a detailed flowchart for illustrating the plane distance calculation step depicted in FIG. 6.

FIG. 7 is a detailed flowchart for illustrating the plane distance calculation step depicted in FIG. 6.

Referring to FIG. 7, the plane distance calculation unit 30 may show a trajectory representing the relationship between the time series information and the change rates of the time series information on a two-dimensional coordinate plane (S310).

The plane distance calculation unit 30 may obtain estimated values representing the time series information and the change rate of the time series information when the electric power system is in a normal state (S320).

The plane distance calculation unit 30 may calculate the moving average of cyclically oscillating data as the estimated values when the electric power system is in a normal state, due to the fact that the normal state is formed inside the trajectory when an oscillation drawing a specific trajectory occurs at the electric power system.

The plane distance calculation unit 30 may depict a point representing the time series information and the change rate of the time series information when the electric power system is in a normal state on the two-dimensional coordinate plane (S330).

The plane distance calculation unit 30 may check whether a slope of the trajectory representing the relationship between the time series information and the change rate of the time series information on the two-dimensional coordinate plane satisfies the measurement point condition (S340).

For example, the plane distance calculation unit 30 may select a point at which the effective value change rate ($X_2$) has a value equal to or smaller than the change rate ($\overline{X_2}^*$) of the time series information when the electric power system is in a normal state, in the trajectory representing indicates the relationship between the time series information measured at the electric power system and the change rate of the time series information, and the slope of the trajectory changes from a positive value to a negative value, as the measurement point.

The plane distance calculation unit 30 may select a point at which the slope satisfies a measurement point condition in the trajectory representing the relationship between the time series information and the change rate of the time series information on the two-dimensional coordinate plane as the measurement point (S340), and calculate a distance from the measurement point to a point representing that the electric power system depicted on the two-dimensional plane is in the normal state, as the plane distance (S350).

The plane distance calculation unit 30 may calculate a distance from the measurement point according to Equations 18 to 20 to the coordinate value ($\overline{X_1}^*, \overline{X_2}^*$) representing the case where the electric power system is in the normal state, as the plane distance ($r(t)$).

Accordingly, the plane distance calculation unit 30 may calculate the plane distance at every cycle of oscillation occurring at the electric power system.

Figure 8:
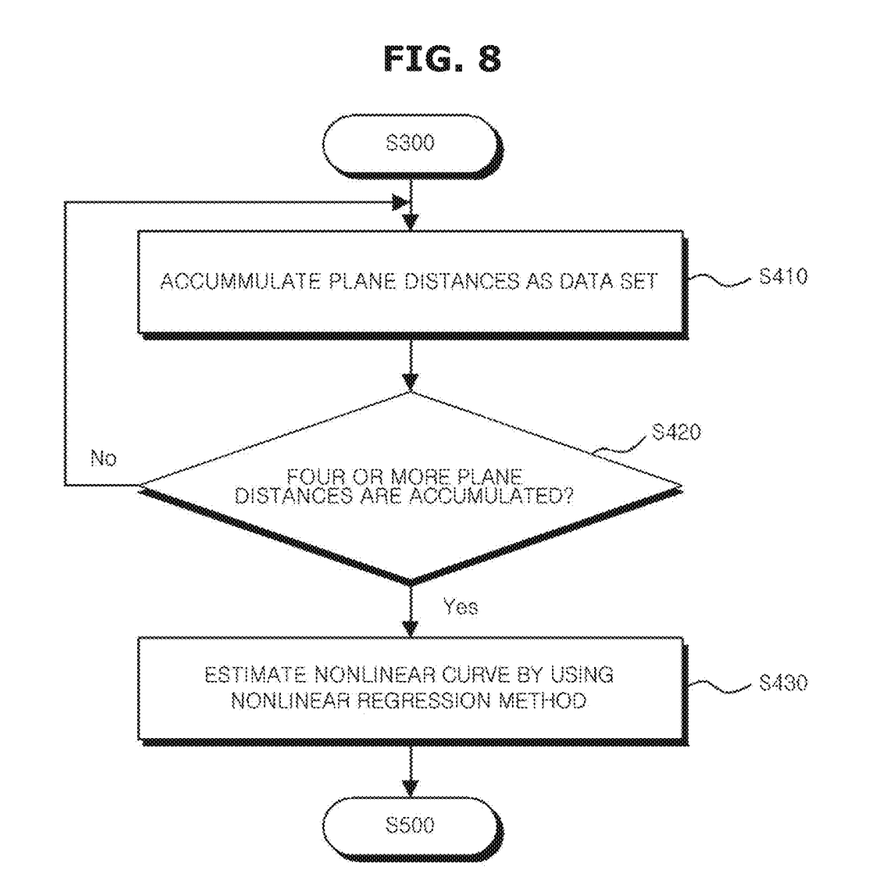
FIG. 8 is a detailed flowchart for illustrating the nonlinear curve estimation step depicted in FIG. 6.

FIG. 8 is a detailed flowchart for illustrating the nonlinear curve estimation step depicted in FIG. 6.

Referring to FIG. 8, the regression estimation unit 40 may accumulate the plane distances as a data set (S410).

The regression estimation unit 40 may check whether four or more plane distances are accumulated (S420).

The regression estimation unit 40 estimates a nonlinear curve from the data set of plane distances according to the nonlinear regression method. According to Equation 21, at least four cumulated data are required due to four estimation variables.

If four or more plane distances are accumulated (S420), the regression estimation unit 40 may estimate the nonlinear curve by applying the plane distance to a nonlinear regression model of an exponential form (S430).

The nonlinear regression model may estimate the nonlinear curve so that the residual error is minimized and the R squared value becomes close to 1, by using the nonlinear regression model as in Equation 21.

Figure 9:
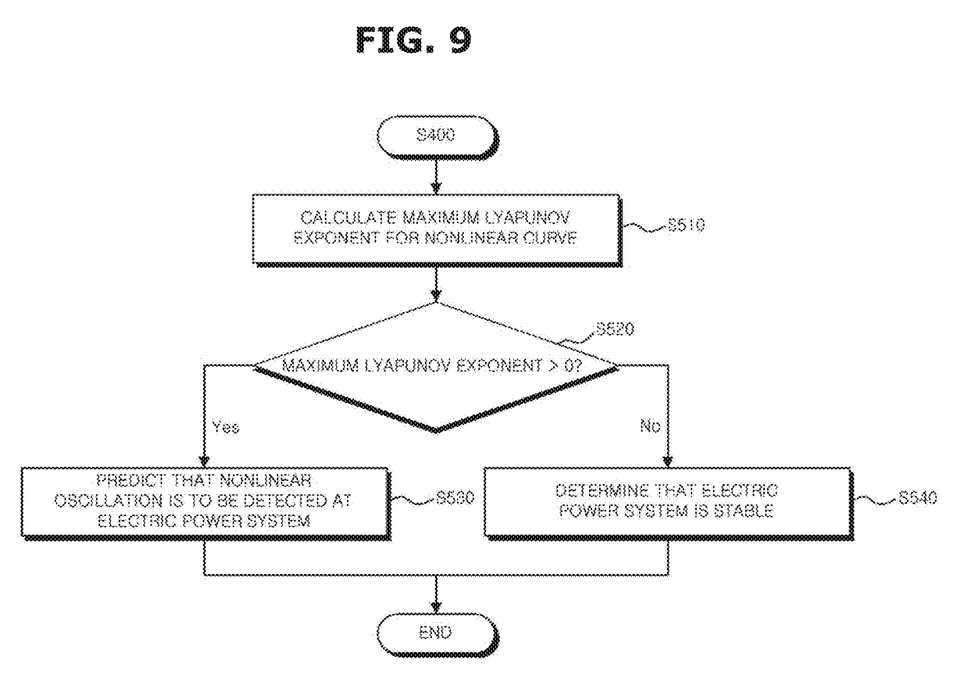
FIG. 9 is a detailed flowchart for illustrating the nonlinear oscillation occurrence prediction step depicted in FIG. 6.

FIG. 9 is a detailed flowchart for illustrating the nonlinear oscillation occurrence prediction step depicted in FIG. 6.

Referring to FIG. 9, the determination unit 50 may calculate the largest Lyapunov exponent for the nonlinear curve (S510).

The determination unit 50 may calculate the largest Lyapunov exponent for the nonlinear curve by using Equation 23.

If the largest Lyapunov exponent exceeds 0 (S520), the determination unit 50 may predict that nonlinear oscillation is to be detected at the electric power system (S530).

If the largest Lyapunov exponent is 0 or less (S530), the determination unit 50 may determine that the electric power system is stable (S540).

The nonlinear oscillation detection method of the present disclosure may be implemented in the form of an application or program commands executable by various computer components and be recorded on a computer-readable recording medium. The computer-readable recording medium may include program commands, data files, data structures or the like solely or in combination.

The program commands recorded on the computer-readable recording medium may be specially designed or configured for the present disclosure or known to and available by computer software engineers.

The computer-readable recording medium includes, for example, magnetic media such as a hard disk, a floppy disk and a magnetic tape, optical media such as CD-ROM and DVD, magneto-optical media such as a floptical disk, hardware devices such as ROM, RAM and a flash memory, specially configured to store and perform program commands, or the like.

The program commands include not only machine codes made by a complier but also high-level language codes executable by a computer by using an interpreter. The hardware device may be configured to operate as at least one software module to perform the operations of the present disclosure, or vice versa.

While the present disclosure has been described with reference to the embodiments, it will be understood by those skilled in the art that various changes and modifications can be made without departing from the scope of the present disclosure as set forth in the appended claims.

REFERENCE SIGNS

1: nonlinear oscillation detection apparatus
10: measurement unit
20: change rate calculation unit
30: plane distance calculation unit
40: regression estimation unit
50: determination unit
60: frequency calculation unit
70: display unit

What is claimed is:

1. A nonlinear oscillation detection apparatus, comprising:
   a measurement unit configured to obtain time series information by measuring a physical quantity of an electric power system whose nonlinear oscillation is to be detected;
   a change rate calculation unit configured to calculate a change rate of the time series information;
   a plane distance calculation unit configured to:
      depict a trajectory representing a relationship between the time series information and the change rate of the time series information and a point representing a normal state of the electric power system on a two-dimensional coordinate plane, and
      selectively calculate a distance from each point of the trajectory representing the relationship between the time series information and the change rate of the time series information to the point representing the normal state of the electric power system;
   a regression estimation unit configured to estimate a nonlinear curve by using the plane distance that is the distance from each point of the trajectory representing the relationship between the time series information and the change rate of the time series information to the point representing the normal state of the electric power system; and
   a determination unit configured to determine whether nonlinear oscillation occurs at the electric power system by calculating a largest Lyapunov exponent of the nonlinear curve,
   wherein the plane distance calculation unit is configured to obtain moving averages of the time series information and the change rate of the time series information during one cycle of oscillation represented by the physical quantity of the electric power system respectively as estimated values representing the time series information and the change rate of the time series information when the electric power system is in a normal state.

2. The nonlinear oscillation detection apparatus according to claim 1, further comprising:
   a frequency calculation unit configured to calculate a frequency of oscillation represented by the physical quantity of the electric power system by measuring time whenever the plane distance is calculated during one cycle of the oscillation represented by the physical quantity of the electric power system.

3. The nonlinear oscillation detection apparatus according to claim 1,
   wherein the plane distance calculation unit selects a point in the trajectory representing the relationship between the time series information and the change rate of the time series information at which the change rate of the time series information has a value equal to or smaller than a change rate of time series information when the electric power system is in a normal state and a slope of the trajectory changes from a positive value to a negative value, as the measurement point.

4. The nonlinear oscillation detection apparatus according to claim 1,
   wherein the regression estimation unit estimates the nonlinear curve by applying a nonlinear regression method to a data set in which the plane distance calculated at every cycle of oscillation represented by the physical quantity of the electric power system is accumulated.

5. The nonlinear oscillation detection apparatus according to claim 1,
   wherein when the largest Lyapunov exponent of the nonlinear curve exceeds 0, the determination unit predicts that nonlinear oscillation is to be detected at the electric power system.

6. The nonlinear oscillation detection apparatus according to claim 1, further comprising:
   an output unit configured to output the determination result of the determination unit on whether nonlinear oscillation is to be detected.

7. A nonlinear oscillation detection method of a nonlinear oscillation detection apparatus that is included in an electric power system to detect nonlinear oscillation of equipment of the electric power system, the nonlinear oscillation detection method comprising:
   obtaining time series information by measuring a physical quantity of the electric power system;
   calculating a change rate of the time series information;

depicting a trajectory representing a relationship between the time series information and the change rate of the time series information and a point representing a normal state of the electric power system on a two-dimensional coordinate plane, and selectively calculating a distance from each point of the trajectory representing the relationship between the time series information and the change rate of the time series information to the point representing the normal state of the electric power system;

estimating a nonlinear curve by using a plane distance that is the distance from each point of the trajectory representing the relationship between the time series information and the change rate of the time series information to the point representing the normal state of the electric power system; and determining whether nonlinear oscillation occurs at the electric power system by calculating a largest Lyapunov exponent of the nonlinear curve, wherein the step of depicting a trajectory representing a relationship between the time series information and the change rate of the time series information and a point representing a normal state of the electric power system on a two-dimensional coordinate plane further includes obtaining moving averages of the time series information and the change rate of the time series information during one cycle of oscillation represented by the physical quantity of the electric power system respectively as estimated values representing time series information and a change rate of the time series information when the electric power system is in a normal state.

8. The nonlinear oscillation detection method according to claim 7, further comprising: calculating a frequency of oscillation represented by the physical quantity of the electric power system by measuring time whenever the plane distance is calculated during one cycle of the oscillation represented by the physical quantity of the electric power system.

9. The nonlinear oscillation detection method according to claim 7, wherein the step of estimating a nonlinear curve by using a plane distance that is the distance from each point of the trajectory representing the relationship between the time series information and the change rate of the time series information to the point representing the normal state of the electric power system includes:

estimating the nonlinear curve by applying a nonlinear regression method to a data set in which the plane distance calculated at every cycle of oscillation represented by the physical quantity of the electric power system is accumulated.

10. The nonlinear oscillation detection method according to claim 7, wherein the step of determining whether nonlinear oscillation occurs at the electric power system by calculating a largest Lyapunov exponent of the nonlinear curve includes:

predicting that nonlinear oscillation is to be detected at the electric power system when the largest Lyapunov exponent of the nonlinear curve exceeds 0.

11. A nonlinear oscillation detection method of a nonlinear oscillation detection apparatus that is included in an electric power system to detect nonlinear oscillation of equipment of the electric power system, the nonlinear oscillation detection method comprising:

obtaining time series information by measuring a physical quantity of the electric power system;

calculating a change rate of the time series information;

depicting a trajectory representing a relationship between the time series information and the change rate of the time series information and a point representing a normal state of the electric power system on a two-dimensional coordinate plane, and selectively calculating a distance from each point of the trajectory representing the relationship between the time series information and the change rate of the time series information to the point representing the normal state of the electric power system;

estimating a nonlinear curve by using a plane distance that is the distance from each point of the trajectory representing the relationship between the time series information and the change rate of the time series information to the point representing the normal state of the electric power system; and determining whether nonlinear oscillation occurs at the electric power system by calculating a largest Lyapunov exponent of the nonlinear curve, wherein the step of selectively calculating a distance from each point of the trajectory representing the relationship between the time series information and the change rate of the time series information to the point representing the normal state of the electric power system includes:

selecting a measurement point according to a slope of the trajectory representing the relationship between the time series information and the change rate of the time series information; and calculating a distance from the measurement point to the point representing the normal state of the electric power system as the plane distance.

12. The nonlinear oscillation detection method according to claim 11, wherein the step of selecting a measurement point according to a slope of the trajectory representing the relationship between the time series information and the change rate of the time series information includes:

selecting a point in the trajectory representing the relationship between the time series information and the change rate of the time series information at which the change rate of the time series information has a value equal to or smaller than a change rate of time series information when the electric power system is in a normal state and a slope of the trajectory changes from a positive value to a negative value, as the measurement point.

* * * * *